United States Patent
Kumar et al.

(10) Patent No.: US 7,092,827 B2
(45) Date of Patent: Aug. 15, 2006

(54) EDGE PLACEMENT ACCURACY OF SIGNALS GENERATED BY TEST EQUIPMENT

(75) Inventors: Chethan Y. B. Kumar, Bangalore (IN); Ravishanker Pasupuleti, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/710,873

(22) Filed: Aug. 10, 2004

(65) Prior Publication Data

US 2006/0036387 A1    Feb. 16, 2006

(51) Int. Cl.
G06F 19/00    (2006.01)

(52) U.S. Cl. ............... 702/57; 702/69; 702/117; 702/119; 324/158.1; 714/815

(58) Field of Classification Search ............... None
See application file for complete search history.

(56) References Cited

U.S. PATENT DOCUMENTS

| | | | | |
|---|---|---|---|---|
| 6,606,575 B1 * | 8/2003 | Miller | ............... | 702/104 |
| 6,661,860 B1 * | 12/2003 | Gutnik et al. | ............... | 375/354 |
| 6,693,436 B1 * | 2/2004 | Nelson | ............... | 324/537 |
| 6,772,382 B1 * | 8/2004 | Schaber et al. | ............... | 714/744 |
| 6,794,861 B1 * | 9/2004 | Maassen et al. | ............... | 324/158.1 |
| 2002/0049554 A1 * | 4/2002 | Miller | ............... | 702/104 |
| 2002/0135357 A1 * | 9/2002 | Maassen et al. | ............... | 324/158.1 |
| 2003/0028832 A1 * | 2/2003 | Schaber et al. | ............... | 714/700 |
| 2005/0097420 A1 * | 5/2005 | Frisch et al. | ............... | 714/742 |
| 2005/0182588 A1 * | 8/2005 | Chenoweth et al. | ............... | 702/118 |

OTHER PUBLICATIONS

"Image Solutions V7.0 : Online Documentation (Catalyst Specifications)", Available from Teradyne Inc , Boston, MA 02118-2238, USA, +1/ 617 482-2700, Jun. 1999, pp. 01-30 (30 pages).

"Image Answers Version 6.4D4 (Catalyst Digital Subsystems)", Version date 9913, Available from Teradyne Inc , Boston, MA 02118-2238, USA, +1/ 617 482-2700, Jun. 1999, pp. 01-31 (31 Pages).

* cited by examiner

Primary Examiner—Carol S. W. Tsai
(74) Attorney, Agent, or Firm—Yingsheng Tung; W. James Brady, III; Frederick J. Telecky, Jr.

(57) ABSTRACT

A software controlled mechanism causing a test equipment to place the edges of test signals accurately. The mechanism determines expected time of occurrence of an edge of a signal in relation to a tester cycle time. The mechanism sends commands to the test equipment to receive back the signal (of interest) in multiple cycles and provides the time points corresponding to the edge in the multiple cycles. The software controlled mechanism computes an error based on the time points and the expected time, and adjusts the timing of the edges of the signal according to the error. Such computation and adjustment are performed until the error is within an acceptable range.

16 Claims, 6 Drawing Sheets

EDGE PLACEMENT ACCURACY OF SIGNALS GENERATED BY TEST EQUIPMENT

BACKGROUND OF INVENTION

1. Field of the Invention

The present invention relates to testing of integrated circuits, and more specifically to a method and apparatus to improve edge placement accuracy of signals generated by test equipment.

2. Related Art

Test equipment is often used to test integrated circuits/devices after fabrication. In a typical scenario, a test equipment generates various signals required for testing an integrated circuit (IC), and examines the generated output to determine whether a tested IC/device ("device under test", DUT) operates in a desired manner or not.

Page of One general requirement with test equipment is that the signals be generated with appropriate timing. That is, the edges of the signals (which generally drive the transitions from one state to another) need to occur with a desired gap/duration, and with a desired relative positions with respect to other signals. For example, when a clock signal is used to sample data, the transitions of the data and clock signals need to satisfy the setup and hold time considerations, well known in the relevant arts.

However, the signals used for testing may not be generated accurately due to reasons such as the inherent nature of hardware components of test equipment. The degree of deviation may not be the same for all the generated signals. Accordingly, many commercially available test equipment specify the degree of deviation from accurate delays with which the test signals may be generated. For example, Catalyst test equipment (CAT50 and CAT400 products with a DRATE between 50–400 MHz) commercially available from Teradyne, Inc., (321 Harrison Avenue, Boston, Mass. 02118_2238 USA, Phone Number: +1/617 482_2700) specifies that the deviation can be between +/−282 ps (pico-seconds) to +/−700 ps.

One problem with such different degree of deviations is that timing requirements of the signals to test ICs may not be met. For example, to test integrated circuits operating at a frequency of 840 MHz, equals a time period of about 1190 ps. Achieving both setup and hold times within the 1190 ps with such high degree of deviation within +/_50 ps (pico-_seconds) may present challenges.

What is needed at least for such reasons is a method and apparatus to improve edge placement accuracy of signals generated by test equipments.

BRIEF DESCRIPTION OF DRAWINGS

The present invention will be described with reference to the following accompanying drawings.

FIG. (FIG.)1 is a block diagram illustrating the details of an example environment in which various aspects of the present invention may be implemented.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

An aspect of the present invention provides a software controlled mechanism by which the edge placement accuracy of a signal generated by a test equipment may be improved. The mechanism may measure the difference between an actual time of occurrence of an edge of a signal and an expected time of occurrence of the edge, and adjust the timing of the edges of the signal based on the difference to place the edges consistent with the expected time of occurrence.

Such measurement and adjustment of a signal may be repeated until the difference is within an acceptable range. In addition, the actual time of occurrence may be determined based on examination of many (e.g., 10 to a few thousands) edges.

Due to such an approach, the edges of the signals may be adjusted quickly and potentially while testing each integrated circuit (or a batch containing a few of the ICs). As a result, the testing accuracy may be improved, in addition lowering the costs.

In one embodiment described below, such a mechanism is implemented in a computer (digital processing) system provided external to a test equipment. The computer system may request the test equipment data indicating the time points at which the edge of a signal (of interest) has occurred, and use the time points to determine the actual time of occurrence using a statistical approach (e.g., mean or median). The computer system may further provide appropriate commands to the test equipment to adjust the timing of the edges of the signals.

The expected time of occurrence and the actual time of occurrence of edges may be computed in relation to a tester cycle time provided by a test equipment. As is well known, a tester cycle time generally refers to a cycle in relation to which various waveforms defining various signals to be generated by the test equipment are specified. The tester then repeats such specified waveforms every successive tester clock cycle. The tester cycle time allows reliable measurement of the difference in multiple iterations since testers are generally designed to generate tester cycles accurately (since several test signals are generated based on the timing of the tester cycle time).

All the signals having any desired timing relationships may be similarly adjusted with respect to the tester cycle time. Since all the signals are adjusted with respect to the same tester cycle time, various relative timing requirements of the signals may be met easily. For example, adequate setup and hold times may be ensured when processing data using sequential logic elements by accurately placing the edges of both clock and data signals with respect to the tester cycle time.

Various aspects of the present invention are described below with reference to an example problem. Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well_known structures or operations are not shown in detail to avoid obscuring the invention.

2. Example Environment

Figure 1:
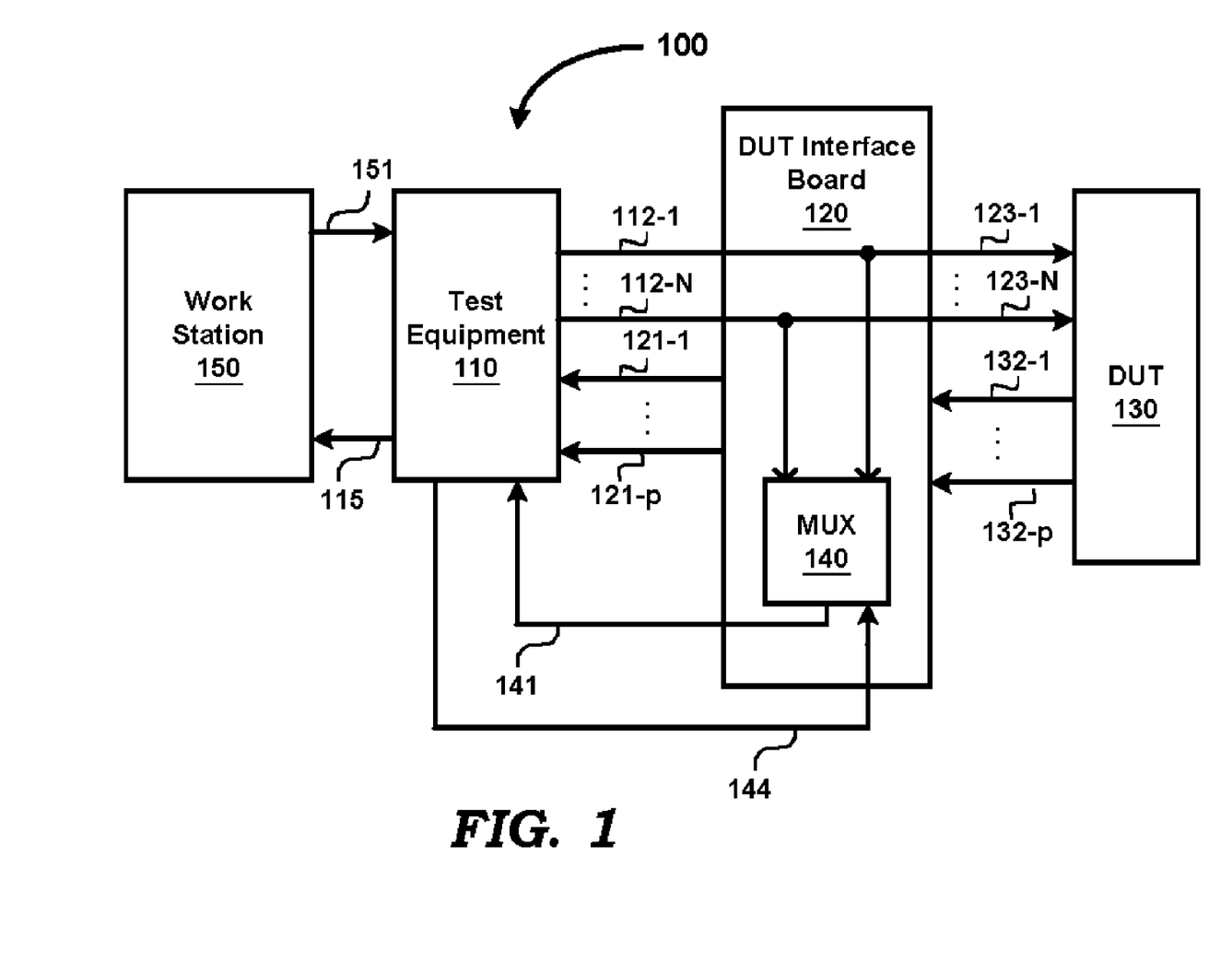

FIG. 1 is a block diagram illustrating the details of an example test environment in which various aspects of the present invention may be implemented. Test environment 100 is shown containing test equipment 110, device under test (DUT) interface board 120, DUT 130 and work station 150. Each block is described below.

DUT 130 represents an example circuit or device presently under test. In general, DUT 130 processes the input signals received on paths 123-1 through 123-N and provides the corresponding response on paths 132-1 through 132-P. The input signals may be designed to perform various tests on DUT 130 and the results of such tests may be examined to determine whether DUT 130 operates in a desired manner.

DUT interface board 120 receives signals on paths 112-1 through 112-N and forwards the received signals on respective paths 123-1 through 123-N. DUT interface board 120 also receives signals on paths 132-1 through 132-P, and forwards the same signals on respective paths 121-1 through 121-P.

DUT interface board 120 further contains multiplexer 140, which selects one signal out of N-input signals received on paths 112-1 through 112-N based on a select data received on path 144. By looping back the signal in multiplexor 140 (which is located close to DUT 130), the looped back signal may contain various noise components which would be presented to DUT 130. The accuracy of edge placement may be enhanced as a result (compared to looping back within test equipment 110).

Multiplexor 140 may be implemented in the form of relays which are configured according to the select data. Multiplexor 140 provides the selected signal on path 141. In other words, a signal of interest specified by the select data is looped back on path 141. The select data may also be provided by work station 150.

Test equipment 110 generates various signals on paths 112-1 through 112-N required for testing a device. Test equipment 110 may also receive the results of each test performed by DUT 130 on paths 121-1 through 121-P, and examine the results to verify the accuracy of operation of DUT 130.

Test equipment 110 generates select data (which may be provided by work station 150) on path 144 and receives the corresponding one of the selected signal 112-1 through 112-N fed back on path 141 (by DUT interface board 120). Test equipment 110 examines the signal received on path 141 and provides on path 115 data indicating the corresponding time of occurrence of the edge of the signal in multiple tester cycles. In an embodiment, test equipment 110 is implemented using Catalyst Product available from Teradyne, Inc., noted above.

Work station 150 (an example of a digital processing system) provides a programmable interface for a user to interface with test equipment 110. For example, work station 150 can be used to program/specify the timing of edges of signals within a tester cycle time initially, sends control signals to configure multiplexor 140 and perform testing, calibration, etc.

In addition, work station 150 receives data representing the time of occurrence of edge of the received signal in multiple tester cycles, examines the time points, and adjusts the timing of the edges of the signal accurately to place the edges of the signal as descried below with reference to FIG. 3.

However, it may be first helpful to understand an example problem without implementing one or more features of the present invention. Accordingly, such an example problem is described below.

3. Example Problem

Figure 2:
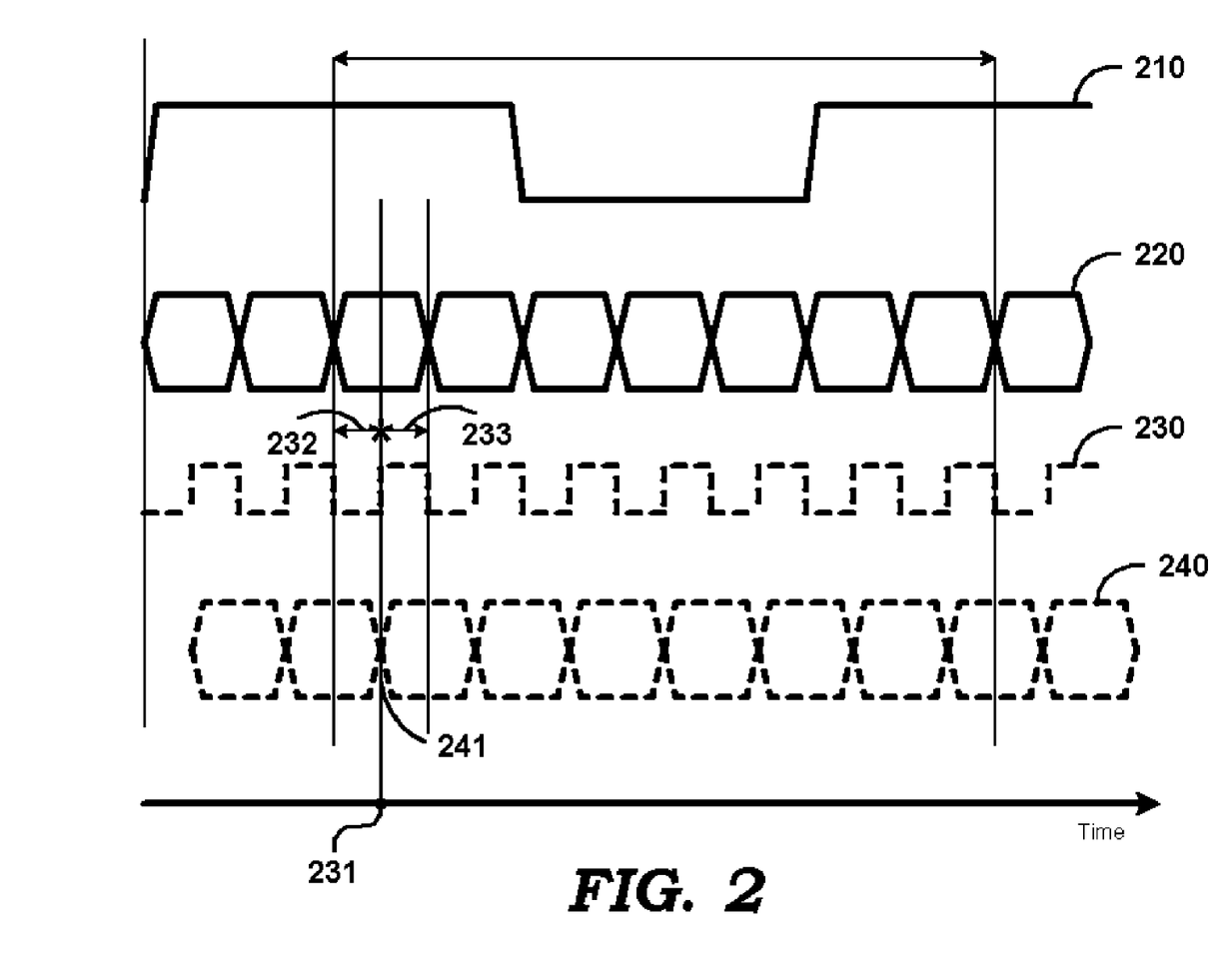
FIG. 2 is a timing diagram illustrating the details of an example problem without operation of at least some aspects of the present invention.

FIG. 2 is a timing diagram illustrating the details of an example problem without operation of at least some aspects of the present invention. For illustration, the timing diagram is described with reference to FIG. 1. Waveforms 210, 220 and 230 respectively represent a clock signal, a data signal and an internal clock signal, as described below in further detail.

Clock signal 210 and data signal 220 are generated by test equipment 110, and transmitted on respective paths (two of 112-1 through 112-N).

Internal clock signal 230 (shown with dotted lines) is generated by DUT 130 using clock signal 210, for example, using one of well-known techniques. Internal clock signal 230 is of higher frequency than clock signal 210 since challenges are often encountered in several commercial test equipments to generate high frequency clock signals with which integrated circuits would operate.

Thus, for illustration, internal clock signal 230 is shown with seven times higher frequency than clock signal 210. Similarly, data signal 220 is also shown seven times higher frequency than clock signal 210 since data is sampled with reference to internal clock signal 230.

The timing of strobe point of data need to be chosen such that sufficient setup and hold times are ensured. For example, time point 231 needs to be selected such that the desired setup time 232 and hold time 233 are obtained while strobing the correct data value.

However, changes in the timing of the edges of clock signal 210 and/or data signal 220 may cause the strobe point to be changed, which may not ensure adequate setup and hold times. As a result, the data may not be sampled accurately. For example, if data signal 220 is changed as shown with reference to waveform 240 (shown with dotted lines), the change in timing of the edges of data signal 240 causes the data value to be sampled incorrectly at same strobe point 231 since data signal 240 is in transition as shown by 241.

Therefore, it may be required to adjust the timing of the edges of the signals generated by the test equipment accurately. The timing of the edges of signals may be adjusted accurately according to several aspects of the present invention as described below with reference to FIG. 3.

4. Method

Figure 3:
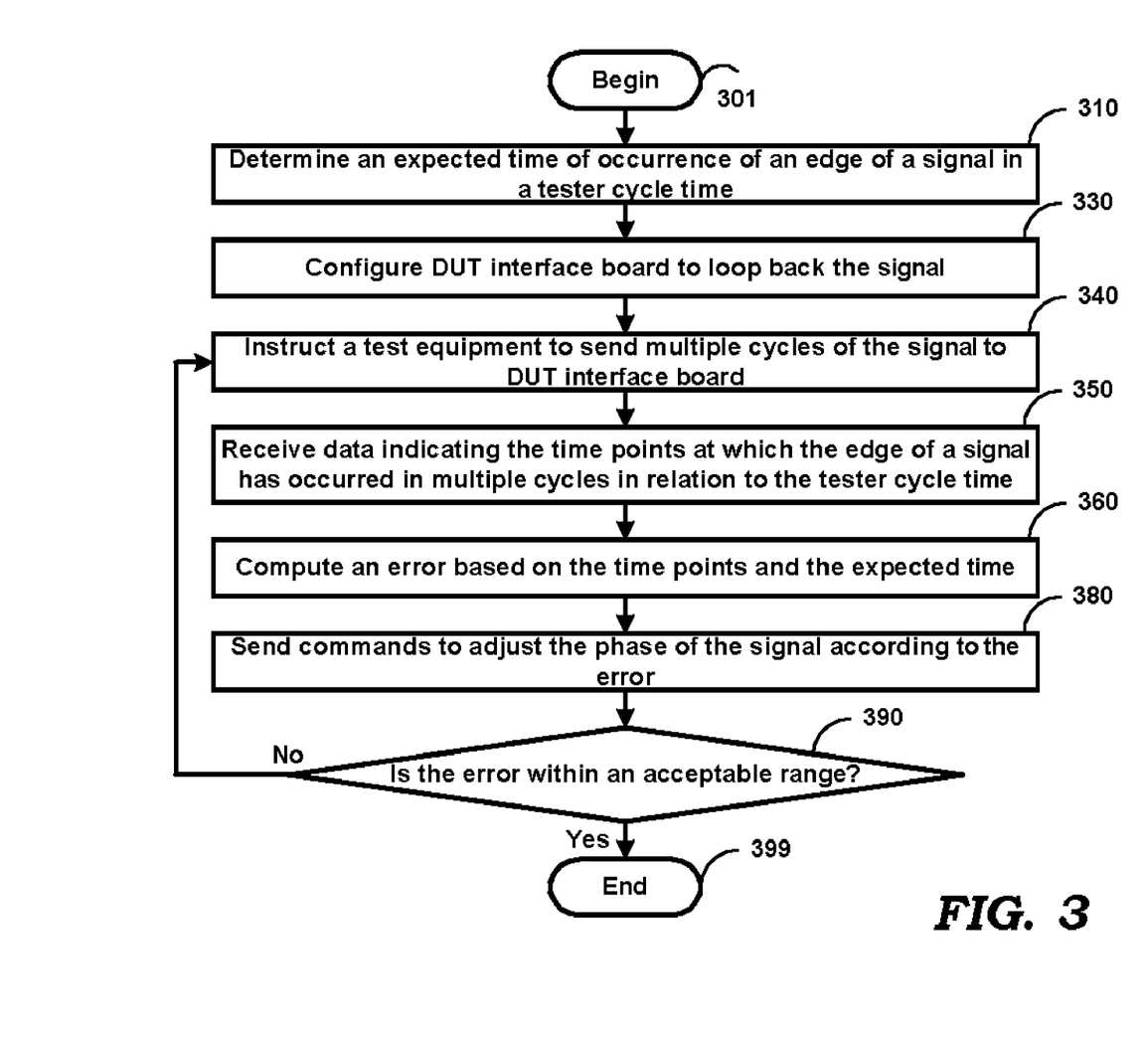
FIG. 3 is a flowchart illustrating the manner in which the edge placement accuracy of signals generated by a test equipment may be improved according to an aspect of the present invention.

FIG. 3 is a flowchart illustrating the manner in which work station 150 may improve the edge placement accuracy of signals generated by test equipment 110 according to an aspect of the present invention. For illustration, the method is described with reference to FIG. 1. The method starts in step 301, in which control immediately transfers to step 310.

In step 310, work station 150 determines an expected time of occurrence of an edge of a signal of interest in a tester cycle time. In an embodiment, the determination is performed based on the specification (e.g., indicating the portions of the tester cycle time in which the signal is to be at logic high/low) of the signal within the tester cycle time. As noted above, the waveform corresponding to each signal generated by test equipment 110 is specified in relation to the tester cycle time.

Work station 150 may configure test equipment 110 to generate various signals required to test DUT 130 by corresponding specifications, and the expected time of occurrence of the edge for a signal may be determined based on the corresponding specification. In one implementation, test equipment 110 operates at a frequency of 50 Mhz and tester cycle time equals 20 nano-seconds.

In step 330, work station 150 sends commands to test equipment 110 to cause DUT interface board 120 to be configured to loop back the signal of interest received from test equipment 110. In an embodiment, test equipment 110 provides a suitable interface by which work station 150 can send commands requesting the loopback. The looped back signal is received on path 141 as noted above.

In step 340, work station 150 instructs test equipment 110 to send multiple cycles of the signal to DUT interface board 120. DUT interface board 120 loop backs the multiple cycles of the signal to test equipment 110 on path 141, due to the configuration of step 330.

In step 350, work station 150 receives data indicating the time points at which the edge of a signal has occurred in multiple cycles in relation to the tester cycle time. In an embodiment, work station 150 sends a threshold voltage level to test equipment 110 and receives the time points at which the edge of the signal crosses the threshold voltage level in each tester cycle time. To support such a feature, test equipment 110 may compare the voltage level of the received signal many times (e.g., 1000) during each tester cycle, and provide the result to work station 150 using a suitable interface.

In step 360, work station 150 computes an error based on the time points and the expected time. In an embodiment, work station 150 computes the mean time of occurrence of edge of the signal from the time points and calculates the error equaling the difference of the mean time and expected time (computed in step 310). In such an approach, the mean value represents the actual time of occurrence of the edge. The manner in which the actual time of occurrence of the edge of the signal may be computed is described in sections below with reference to FIGS. 5A and 5B.

In step 380, work station 150 adjusts the timing of the edges of the signal according to the error determined in step 360. For example, assuming that the expected time equals 5 ns (with respect to the tester cycle time) and the error equals −0.5 ns, then the time of occurrence of the edge is corrected to be at 4.5 ns. The signal from then onwards is generated based on the new adjusted edges.

In step 390, a determination is made as to whether the error is within an acceptable range. For illustration, in one embodiment, error needs to be less than 50 ps for reliable operation of DUT 130. Control then passes to step 340 if the error is not in acceptable range, else control passes to step 399, in which the method ends. Steps 340–380 are repeated until the error is within an acceptable value. As a result, the edge of a signal may be placed accurately.

Even though the description of FIG. 3 is provided with reference to a single signal, it should be understood that the approach may be used to adjust the timing of the edges of each signal of interest generated by test equipment 110. For example, with reference to FIG. 2, the timing of the edges of both clock signal 210 and data signal 220 may be adjusted with respect to the tester cycle time. As a result, the desired setup and hold times may be ensured.

It may be noted that by measuring the actual time of occurrence of the edge and adjusting the timing of the edges of the signal in multiple iterations with respect to the tester cycle time (which is generated accurately as noted above), the accuracy of the edge placement of the signal may be improved. The manner in which the error in the edge placement of a signal may be reduced in multiple iterations is described below with reference to FIG. 4.

5. Timing Diagram

Figure 4:
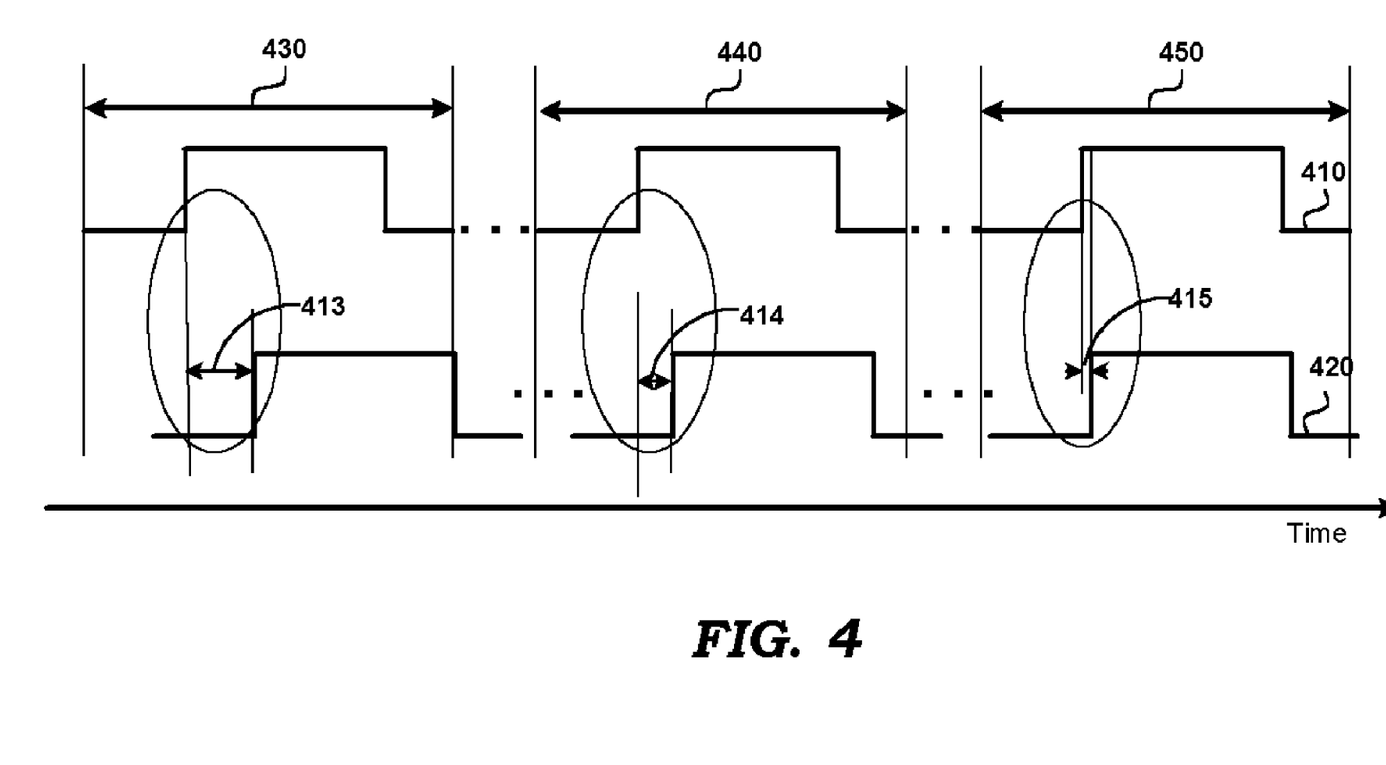
FIG. 4 is a timing diagram illustrating the manner in which the edges may be placed accurately in multiple iterations in an embodiment of the present invention.

FIG. 4 is a timing diagram illustrating the manner in which the edges may be placed accurately in multiple iterations in an embodiment of the present invention. For illustration, the timing diagram is described with reference to FIG. 1 and also referring to a clock signal generated by test equipment 110. However, similar approaches may be applied to all the signals generated by test equipment 110.

Waveforms 410 and 420 respectively represent expected clock signal and actual clock signal during multiple tester cycle times 430, 440 and 450. It may be appreciated that many clock cycles are present in the time durations represented by dots ( . . . ), and the error is determined in such durations.

During tester cycle time 430, actual clock signal 420 represents the clock signal received by test equipment 110 before adjusting the timing of the edges of the signal of interest. It may be observed that actual time of occurrence of edge is differing by time duration shown as 413 from the expected time of occurrence of edge of clock signal 410. Work station 150 determines error 413 (for example, as described in sections below), and sends commands (e.g., according to a pre-specified protocol) to test equipment 110 to adjust the time of occurrence of the edge of the clock signal.

During tester cycle time 440, actual clock signal 420 represents the clock signal received by test equipment 110 after adjustment of the timing of the edges based on error 413. Time duration 414 represents the residue error not corrected in the previous tester cycle time 430. Work station 150 determines error 414, and sends commands to test equipment 110 to adjust the time of occurrence of the edge of the clock signal. For illustration, it is assumed that errors 413 and 414 are not within an acceptable range.

The error after correction in tester cycle time 440 is represented by 415 in tester cycle time 450. Assuming the error shown as 415 is within the acceptable range, further adjustment of the timing of the edges of the signal is stopped after $2^{nd}$ iteration. However, the number of iterations depends on the amount of accuracy needed.

It may be noted that after adjusting the timing of the edges of clock signal in multiple iterations, the error may be reduced to acceptable levels. Thus, the accuracy of the time of occurrence of the edge of a signal may be improved further by correcting the timing of the edges of the signal in multiple iterations. The manner in which the actual time of occurrence of edge of a signal may be computed is described below with reference to FIG. 5A and FIG. 5B.

6. Edge Find Technique

Figure 5A:
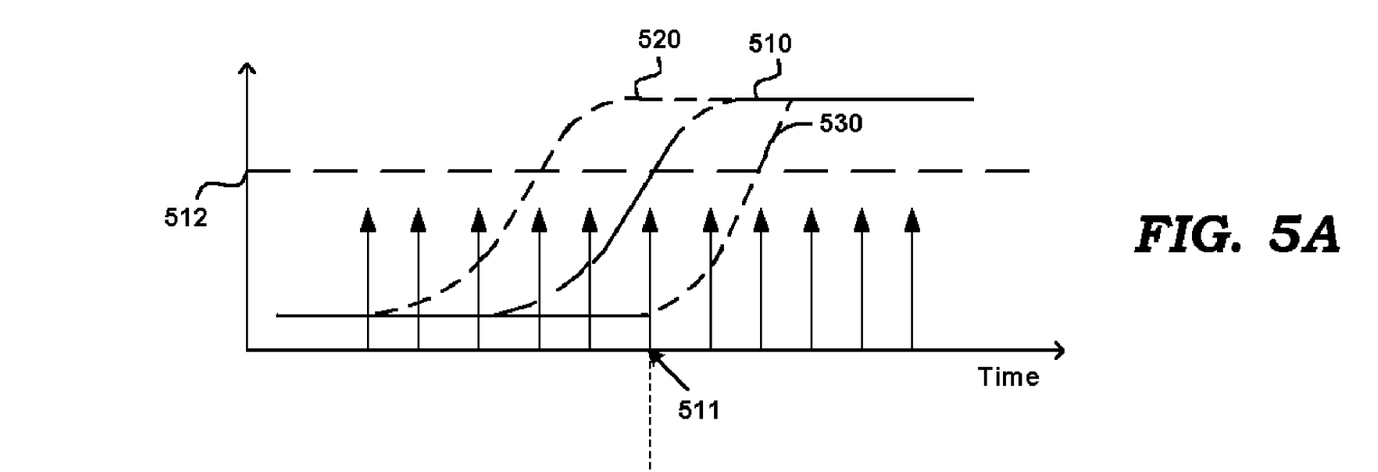
FIG. 5A is a timing diagram illustrating the manner in which a repetitive signal can be sampled to determine the time of occurrence of an edge in one embodiment.
Figure 5B:
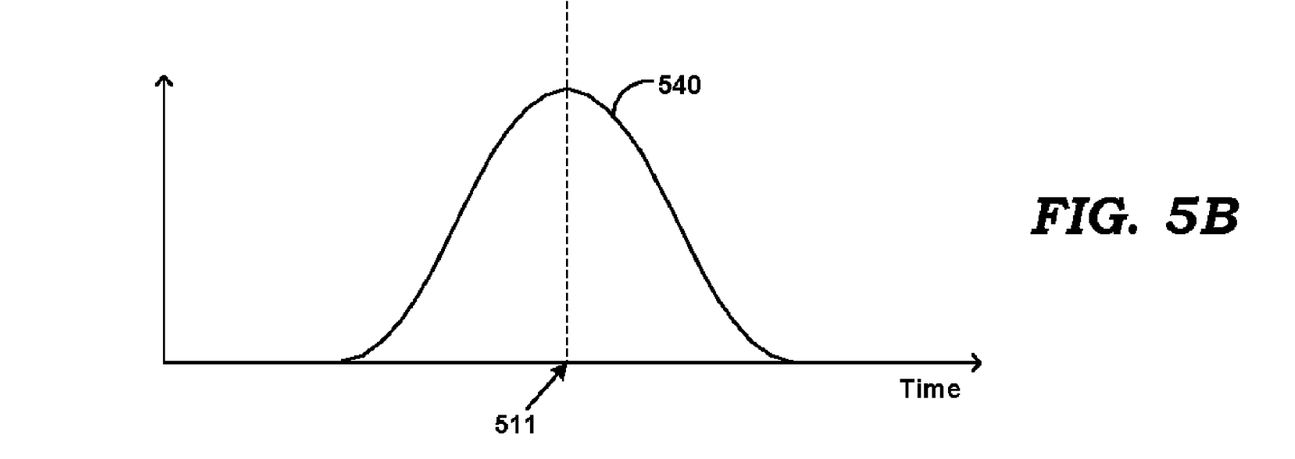
FIG. 5B illustrates the probability distribution of different points of interest in the repetitive signal due to jitter in one embodiment.

FIGS. 5A and 5B are diagrams together illustrating the manner in which the actual time of occurrence of an edge may be determined in an embodiment. In particular, FIG. 5A is a timing diagram illustrating the manner in which a signal can be sampled to determine the time of occurrence of an edge, and FIG. 5B illustrates the probability distribution of occurrence of the edges in the signal due to jitter. The diagrams are described with reference to FIG. 1 for illustration.

With reference to FIG. 5A, X-axis represents time scale corresponding to a portion of the tester cycle time in which an edge is expected to occur. The Y-axis represents voltage level. The diagram is shown containing three signals 510, 520 and 530. Signal 510 is shown by a solid line and represents the ideal signal which would be generated in the absence of jitter/noise. Due to the jitter, the signal may vary in a range as represented by 520 and 530 (shown as dotted lines). As a result, various points of interest may be received according to a probability distribution, as described below with reference to FIG. 5B below.

Continuing with reference to FIG. 5A, line 512 represents a threshold voltage specified by work station 150. Test equipment 110 compares the voltage level of the received signal with threshold voltage 512 at various time points in each tester cycle time and provides each comparison result along with the corresponding time point to work station 150. With reference to line 510, the comparison result may equal one value up to time point 511 and another value thereafter.

Thus, each comparison result and corresponding time point (e.g., a time stamp) may be provided byequipment 110 to work station 150. Work station 150 may examine the received data to determine the time point (511) at which the edge is deemed to have occurred. While the edge detection is described with reference to rising edge merely for illustration, the approaches can be adapted to detect a falling edge as well.

It may be appreciated from the description above that the occurrence of edge may vary in a range due to factors such as jitter, as illustrated with reference to FIG. 5B. With reference to FIG. 5B, X-axis represents the same time line as in FIG. 5A, and Y-axis represents the frequency/probability of occurrence. Thus, the point at which the edge occurs may have a distribution as shown by curve 540, having a mean equaling time point 511. By determining the time of occurrence of an edge using many (e.g., potentially thousands) cycles of the signal of interest, the determined data may represent the accurate value (511).

It may be noted that the approaches may be implemented without requiring user intervention during production testing since work station 150 can be programmed to correct the error in the time of occurrence of the edge before starting the testing. Also, since determining and correction of error consumes only a short time duration, such correction can be repeated in between testing of individual devices or batches thereof.

Thus, various embodiments of test environment 100 may be implemented using the approaches of above. In particular, work station 150 may be implemented as a combination of one or more of hardware, firmware and software. The description is continued with reference to an implementation based on software.

7. Software Implementation

Figure 6:
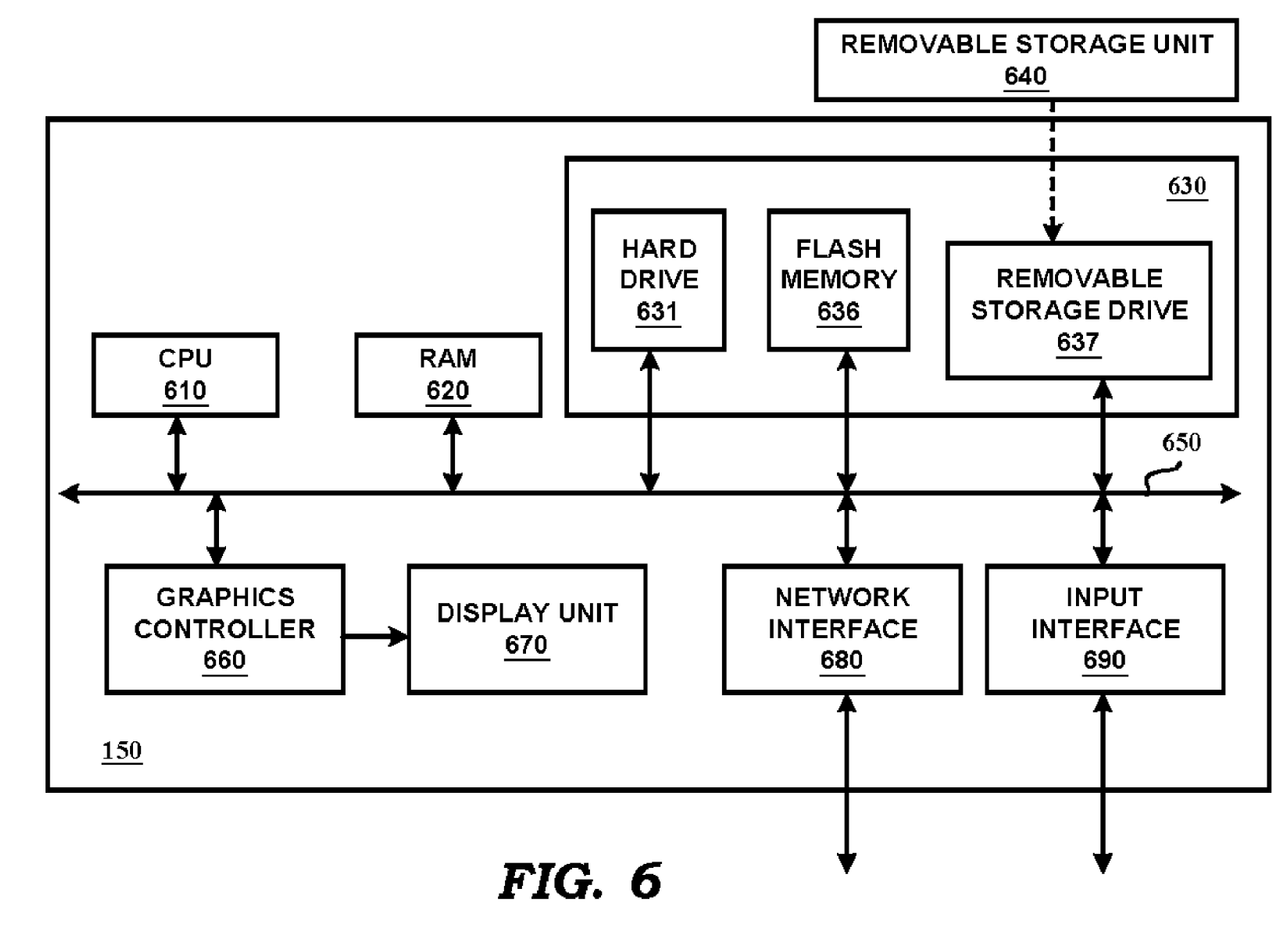
FIG. 6 is a block diagram illustrating the details of a system operable by software instructions to provide several features of the present invention.

FIG. 6 is a block diagram illustrating the details of work station 150 in an embodiment of the present invention. Even though work station 150 is described with specific components and architecture for illustration, it should be understood that the present invention may be implemented in several other types of embodiments.

Work station 150 may contain one or more processors (such as central processing unit (CPU) 610), random access memory (RAM) 620, secondary memory 630, graphics controller 660, display unit 670, network interface 680, and input interface 690. All the components except display unit 670 may communicate with each other over communication path 650, which may contain several buses as is well known in the relevant arts. The components of FIG. 6 are described below in further detail.

CPU 610 may execute instructions stored in RAM 620 to provide several features of the present invention. CPU 610 may contain multiple processing units, with each processing unit potentially being designed for a specific task. Alternatively, CPU 610 may contain only a single processing unit. RAM 620 may receive instructions from secondary memory 630 using communication path 650.

Graphics controller 660 generates display signals (e.g., in RGB format) to display unit 670 based on data/instructions received from CPU 610. Display unit 670 contains a display screen to display the images defined by the display signals. Input interface 690 may correspond to a key_board and/or mouse, and generally enables a user to provide inputs such as the tester cycle time and various specifications of the signals to be generated by test equipment 110. Network interface 680 enables some of the inputs (and outputs) to be provided on a network. In general, display unit 670, input interface 690 and network interface 680 enable a user to test integrated circuits, and may be implemented in a known way.

Secondary memory 630 may contain hard drive 635, flash memory 636 and removable storage drive 637. Secondary memory 630 may store the data (e.g., representations of FSMs related to applications) and software instructions which enable work station 150 to provide several features in accordance with the present invention. Some or all of the data and instructions may be provided on removable storage unit 640, and the data and instructions may be read and provided by removable storage drive 637 to CPU 610. Floppy drive, magnetic tape drive, CD_ROM drive, DVD Drive, Flash memory, removable memory chip (PCMCIA Card, EPROM) are examples of such removable storage drive 637.

Removable storage unit 640 may be implemented using medium and storage format compatible with removable storage drive 637 such that removable storage drive 637 can read the data and instructions. Thus, removable storage unit 640 includes a computer readable storage medium having stored therein computer software and/or data. An embodiment of the present invention is implemented using software running (that is, executing) in work station 150.

In this document, the term "computer program product" is used to generally refer to removable storage unit 640 or hard disk installed in hard drive 635. These computer program products are means for providing software to work station 150. CPU 610 may retrieve the software instructions, and execute the instructions to provide various features of the present invention as described above.

8. Conclusion

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

The invention claimed is:

1. A method of causing a test equipment to accurately place the edges of a signal used to test a device under test (DUT), said method being performed in a digital processing system, said method comprising:

determining an expected time of occurrence of each edge of said signal;

instructing said test equipment to generate a plurality of cycles of said signal in relation to a tester cycle time;

receiving data indicating a plurality of time points at which the edges of said signal have occurred in said plurality of cycles;

computing an error based on said plurality of time points and said expected time; and adjusting a timing of the edges of said signal based on said error.

2. The method of claim 1, wherein each of said expected time and said plurality of time points are indicated in relation to a tester cycle time of said test equipment.

3. The method of claim 2, wherein said plurality of time points comprise at least ten time points.

4. The method of claim 2, further comprising sending a command to configure a device under test (DUT) interface board to loop back said signal to said test equipment.

5. The method of claim 4, further comprising performing the elements of claim 1 until said error is within an acceptable range.

6. The method of claim 2, wherein said computing comprises:

determining a mean value of said plurality of time points; and setting said error to equal a difference of said mean value and said expected time.

7. The method of claim 6, wherein the edges of a clock signal are placed accurately by using said clock signal as said signal, and the edges of a data signal are placed accurately by using said data signal as said signal such that said data signal can be sampled accurately using said clock signal in said DUT.

8. The method of claim 7, further comprising sending to said test equipment a threshold voltage level, said threshold voltage level indicating a voltage level at which said signal is deemed to have transitioned from one logic level to another, wherein said test equipment compares said threshold voltage level to a voltage level of said signal a plurality of times in each tester cycle and provides a comparison result, wherein said data comprises said comparison result and a time of comparison.

9. A machine readable medium carrying one or more sequences of instructions for causing a digital processing system to control a test equipment to accurately place the edges of a signal used to test a device under test (DUT), wherein execution of said one or more sequences of instructions by one or more processors contained in said digital processing system causes said one or more processors to perform the actions of:

determining an expected time of occurrence of each edge of said signal; instructing said test equipment to generate a plurality of cycles of said signal in relation to a tester cycle time;

receiving data indicating a plurality of time points at which the edges of said signal have occurred in said plurality of cycles;

computing an error based on said plurality of time points and said expected time; and adjusting a timing of the edges of said signal based on said error.

10. The machine readable medium of claim 9, wherein each of said expected time and said plurality of time points are indicated in relation to a tester cycle time of said test equipment.

11. The machine readable medium of claim 10, wherein said plurality of time points comprise at least ten time points.

12. The machine readable medium of claim 10, further comprising sending a command to configure a device under test (DUT) interface board to loop back said signal to said test equipment.

13. The machine readable medium of claim 12, further comprising performing the elements of claim 11 until said error is within an acceptable range.

14. The machine readable medium of claim 10, wherein said computing comprises:

determining a mean value of said plurality of time points; and setting said error to equal a difference of said mean value and said expected time.

15. The machine readable medium of claim 14, wherein the edges of a clock signal are placed accurately by using said clock signal as said signal, and the edges of a data signal are placed accurately by using said data signal as said signal such that said data signal can be sampled accurately using said clock signal in said DUT.

16. The machine readable medium of claim 15, further comprising sending to said test equipment a threshold voltage level, said threshold voltage level indicating a voltage level at which said signal is deemed to have transitioned from one logic level to another, wherein said test equipment compares said threshold voltage level to a voltage level of said signal a plurality of times in each tester cycle and provides a comparison result, wherein said data comprises said comparison result and a time of comparison.

* * * * *

UNITED STATES PATENT AND TRADEMARK OFFICE
CERTIFICATE OF CORRECTION

PATENT NO. : 7,092,827 B2  Page 1 of 1
APPLICATION NO. : 10/710873
DATED : August 15, 2006
INVENTOR(S) : Chethan Y.B. Kumar et al.

It is certified that error appears in the above-identified patent and that said Letters Patent is hereby corrected as shown below:

On the Title Page, Item (54)

Correct the title to read: Improving Edge Placement Accuracy of Signals Generated by Test Equipment Signed and Sealed this Twenty-seventh Day of May, 2008

JON W. DUDAS
*Director of the United States Patent and Trademark Office*

UNITED STATES PATENT AND TRADEMARK OFFICE
CERTIFICATE OF CORRECTION

PATENT NO. : 7,092,827 B2  
APPLICATION NO. : 10/710873  
DATED : August 15, 2006  
INVENTOR(S) : Chethan Y.B. Kumar et al.

Page 1 of 1

It is certified that error appears in the above-identified patent and that said Letters Patent is hereby corrected as shown below:

On the Title Page, Item (54) and Column 1, lines 1-3

Correct the title to read: Improving Edge Placement Accuracy of Signals Generated by Test Equipment This certificate supersedes the Certificate of Correction issued May 27, 2008.

Signed and Sealed this

Twenty-fourth Day of June, 2008

JON W. DUDAS  
*Director of the United States Patent and Trademark Office*